United States Patent
Sidhu et al.

(10) Patent No.: US 7,888,771 B1
(45) Date of Patent: Feb. 15, 2011

(54) E-FUSE WITH SCALABLE FILAMENT LINK

(75) Inventors: Lakhbeer Singh Sidhu, Fremont, CA (US); Srikanth Sundararajan, Dublin, CA (US); Michael J. Hart, Palo Alto, CA (US)

(73) Assignee: Xilinx, Inc., San Jose, CA (US)

( * ) Notice: Subject to any disclaimer, the term of this patent is extended or adjusted under 35 U.S.C. 154(b) by 688 days.

(21) Appl. No.: 11/799,886

(22) Filed: May 2, 2007

(51) Int. Cl.
 *H01L 23/52* (2006.01)
(52) U.S. Cl. .............. 257/529; 257/209; 257/413; 257/904; 257/E23.149; 257/E21.592; 438/132; 438/214; 438/281; 438/333; 438/601; 337/251; 365/96; 365/104; 365/177; 365/184
(58) Field of Classification Search ............ 257/209, 257/529, E23.149, E21.592; 438/132, 215, 438/281, 333, 601, 467, 238; 365/96, 105, 365/177, 184, 104; 337/251, 142
See application file for complete search history.

(56) References Cited

U.S. PATENT DOCUMENTS

| | | | |
|---|---|---|---|
| 4,219,836 A | 8/1980 | McElroy | |
| 4,238,839 A | 12/1980 | Redfern et al. | |
| 4,562,454 A | 12/1985 | Schultz et al. | |
| 4,647,340 A | 3/1987 | Szluk et al. | |
| 4,872,140 A | 10/1989 | Graham et al. | |
| 5,166,758 A | 11/1992 | Ovshinsky et al. | |
| 5,708,291 A | 1/1998 | Bohr et al. | |
| 5,742,555 A | 4/1998 | Marr et al. | |
| 5,874,851 A | 2/1999 | Shiota | |
| 6,060,743 A | 5/2000 | Sugiyama et al. | |
| 6,258,700 B1 | 7/2001 | Bohr et al. | |
| 6,368,902 B1 | 4/2002 | Kothandaraman et al. | |
| 6,496,416 B1 | 12/2002 | Look | |
| 6,522,582 B1 | 2/2003 | Rao et al. | |
| 6,525,397 B1 | 2/2003 | Kalnitsky et al. | |
| 6,597,013 B2 | 7/2003 | Romas, Jr. et al. | |
| 6,621,095 B2 | 9/2003 | Chiang et al. | |
| 6,671,205 B2 | 12/2003 | Look | |
| 6,703,680 B2 | 3/2004 | Toyoshima | |
| 6,804,159 B2 | 10/2004 | Kamiya et al. | |

(Continued)

FOREIGN PATENT DOCUMENTS

EP 0 161 947 A 11/1985

(Continued)

OTHER PUBLICATIONS

Toyoji Yamamoto et al., "Bias Temperature Instability in Scaled p+ Polysilicon Gate p-MOSFET's," IEEE Transactions on Electron Devices, vol. 46, No. 5, May 1999, IEEE, 3 Park Avenue, 17th Floor, New York, NY 10016-5997.

(Continued)

*Primary Examiner*—Lynne A Gurley
*Assistant Examiner*—Yosef Gebreyesus
(74) *Attorney, Agent, or Firm*—Scott Hewett

(57) ABSTRACT

An electronic fuse ("E-fuse") has a silicide filament link extending along a gap between polysilicon structures formed on a silicon substrate. The silicide filament link extends across diffusions formed in the gap. A P-N junction between terminals of the E-fuse provides high resistivity after programming (fusing) the silicide filament link.

20 Claims, 4 Drawing Sheets

U.S. PATENT DOCUMENTS

| | | | |
|---|---|---|---|
| 6,807,079 | B2 | 10/2004 | Mei et al. |
| 6,882,571 | B1 | 4/2005 | Look |
| 6,911,360 | B2 | 6/2005 | Li et al. |
| 6,930,920 | B1 | 8/2005 | Look |
| 6,933,591 | B1* | 8/2005 | Sidhu et al. ............... 257/665 |
| 6,936,527 | B1 | 8/2005 | Look |
| 7,026,692 | B1 | 4/2006 | Look |
| 7,068,072 | B2 | 6/2006 | New et al. |
| 7,092,273 | B2 | 8/2006 | Look |
| 7,098,721 | B2 | 8/2006 | Ouellette et al. |
| 7,180,102 | B2 | 2/2007 | Hui |
| 7,224,633 | B1 | 5/2007 | Hovis et al. |
| 2002/0074618 | A1* | 6/2002 | Marshall et al. ............. 257/529 |
| 2003/0211661 | A1* | 11/2003 | Marr et al. ................ 438/128 |
| 2004/0004268 | A1 | 1/2004 | Brown et al. |
| 2004/0124458 | A1* | 7/2004 | Kothandaraman ........... 257/300 |
| 2005/0067670 | A1* | 3/2005 | Hui ............................ 257/529 |
| 2005/0229142 | A1* | 10/2005 | Boppana et al. ............... 716/17 |
| 2005/0247997 | A1 | 11/2005 | Chung et al. |
| 2005/0280083 | A1 | 12/2005 | Vogelsang |
| 2005/0285224 | A1* | 12/2005 | Tsutsui ....................... 257/531 |
| 2006/0170055 | A1* | 8/2006 | Mitros et al. ................ 257/360 |
| 2006/0237818 | A1 | 10/2006 | Chang |
| 2006/0249808 | A1* | 11/2006 | Hsu et al. ................... 257/529 |
| 2007/0063313 | A1 | 3/2007 | Barth et al. |
| 2007/0210412 | A1* | 9/2007 | Booth et al. ................ 257/529 |
| 2007/0252237 | A1* | 11/2007 | Ko et al. .................... 257/529 |
| 2009/0003028 | A1 | 1/2009 | Keshavarzi et al. |
| 2009/0224323 | A1* | 9/2009 | Im et al. ..................... 257/355 |

FOREIGN PATENT DOCUMENTS

| | | |
|---|---|---|
| JP | 2007 042780 A | 2/2007 |
| JP | 2007 194377 A | 8/2007 |

OTHER PUBLICATIONS

Se-Aug Jang et al., "Effects of Thermal Processes After Silicidation on the Performance of TiSi2/Polysilicon Gate Device," IEEE Transactions on Electron Devices, vol. 46, No. 12, Dec. 1999, pp. 2353-2356, IEEE, 3 Park Avenue, 17th Floor, New York, NY 10016-5997.

Rahman, Arifur et al., "Die Stacking Technology for Terabit Chip-to-Chip Communications", Proceedings of 2006 IEEE Custom Integrated Circuits Conference (CICC), Sep. 10-13, 2006, available from IEEE, 3 Park Avenue, 17th Floor, New York, NY 10016-5997.

N. Kimizuka et al., "NBTI enchancement by nitrogen incorporation into ultrathin gat oxide for 0.10-um gate CMOS generation," 2000 Symposium on VLSI Technology Digest of Technical Papers, Apr. 2000, pp. 92-93, IEEE, 3 Park Avenue, 17th Floor, New York, NY 10016-5997.

Mohsen Alavi et al., A PROM Element Based on Salicide Agglomeration of Poly Fuses in a CMOS Logic Process, Jul. 1997, pp. 855-858, IEEE, 3 Park Avenue, 17th Floor, New York, NY 10016-5997.

Jerome B. Lasky et al., "Comparison of Transformation to Low-Resistivity Phase and Agglomeration of TiSi2 and CoSi2," IEEE Transactions on Electron Devices, vol. 38, No. 2, Feb. 1991, pp. 262-269, IEEE, 3 Park Avenue, 17th Floor, New York, NY 10016-5997.

Alexander Kalnitzky et al., CoSi2 integrated fuses on poly silicon for low voltage 0.18um CMOS applications, Sep. 1999, pp. 765-768 IEEE, 3 Park Avenue, 17th Floor, New York, NY 10016-5997.

U.S. Appl. No. 12/043,091, filed Mar. 5, 2008, Im, Hsung Jai, et al., Xilinx, Inc. 2100 Logic Drive, San Jose, CA 95124.

U.S. Appl. No. 12/043,099, filed Mar. 5, 2008, Im, Hsung Jai et al., Xilinx, Inc. 2100 Logic Drive, San Jose, CA 95124.

U.S. Appl. No. 12/043,103, filed Mar. 5, 2008, Im, Hsung Jai, et al., Xilinx, Inc. 2100 Logic Drive, San Jose, CA 95124.

U.S. Appl. No. 12/043,910, filed Mar. 6, 2008, Im, Hsung Jai et al., Xilinx, Inc. 2100 Logic Drive, San Jose, CA 95124.

U.S. Appl. No. 12/043,914, filed Mar. 6, 2008, Im, Hsung Jai et al., Xilinx, Inc. 2100 Logic Drive, San Jose, CA 95124.

U.S. Appl. No. 11/973,062, filed Oct. 4, 2007, Rahman, Arifur et al., Xilinx, Inc. 2100 Logic Drive, San Jose, CA 95124.

U.S. Appl. No. 11/799,886, filed May 2, 2007, Sidhu, Lakhbeer S. et al., Xilinx, Inc. 2100 Logic Drive, San Jose, CA 95124.

U.S. Appl. No. 11/717,836, filed Mar. 13, 2007, Oh, Kwansuhk, et al., Xilinx, Inc. 2100 Logic Drive, San Jose, CA 95124.

U.S. Appl. No. 11/588,775, filed Oct. 27, 2006, Paak, Sunhom et al., Xilinx, Inc. 2100 Logic Drive, San Jose, CA 95124.

U.S. Appl. No. 11/449,171, filed Jun. 8, 2006, Ang, Boon Yong et al., Xilinx, Inc. 2100 Logic Drive, San Jose, CA 95124.

* cited by examiner

E-FUSE WITH SCALABLE FILAMENT LINK

FIELD OF THE INVENTION

The present invention relates generally to semiconductor devices, and more particularly to integrated circuits with memory devices commonly called electrical fuses ("E-fuses").

BACKGROUND OF THE INVENTION

Many integrated circuits ("ICs") are made up of millions of interconnected devices, such as transistors, resistors, capacitors, and diodes, on a single chip of semiconductor substrate. It is generally desirable that ICs operate as fast as possible, and consume as little power as possible. Semiconductor ICs often include one or more types of memory, such as CMOS memory, antifuse memory, and e-fuse memory.

E-fuses are usually integrated into semiconductor ICs by using a stripe (commonly also called a "link") of conducting material (metal, poly-silicon, etc.) between two pads, generally referred to as anode and cathode, so that at a fuse current level ($I_{FUSE}$) the link is thermally destroyed, thus changing the resistance of the E-fuse. This is commonly referred to as "programming" the e-fuse. The fuse state (i.e., whether it has been programmed) can be read using a sensing circuit, which are common in the art of electronic memories.

Unfortunately, conventional E-fuses require substantial current to program, which can cause programming damage to other portions of the IC. Programming reliability is also a concern for conventional E-fuses. Manufacturing variations lead to variations in the optimal programming energy. In some instances, the link is not completely broken, or damage from fuse programming results in a current path having a resistance less than the resistance specified to indicate a programmed fuse.

Another problem arising with E-fuses is that conventional designs do not reliably scale to smaller design geometries. For example, an E-fuse that works acceptably well (i.e., reliably programs to a high-resistance state) in an IC fabricated according to a 90 nm node geometry might produce an unacceptably high number of programming failures when the IC is adapted to a smaller process node such as 65 nm node geometry. Similarly, smaller node geometries are often associated with a lower IC operating voltage, which provides less programming energy for a given programming current. Conventional E-fuses require programming conditions that may be difficult to obtain with a low-voltage IC.

It is desirable to provide E-fuses that avoid limitations of conventional E-fuses.

SUMMARY OF THE INVENTION

An electronic fuse ("E-fuse") has a silicide filament link extending along a gap between polysilicon structures formed on a silicon substrate. The silicide filament link extends across diffusions formed in the gap. A P-N junction between terminals of the E-fuse provides high resistivity after programming (fusing) the silicide filament link. In a particular embodiment, the diffusions include a first diffusion and a second diffusion. A further embodiment includes a lightly doped diffusion. In a particular embodiment, the E-fuse is a non-volatile memory element in a CMOS integrated circuit.

DETAILED DESCRIPTION OF THE DRAWINGS

Figure 1A:
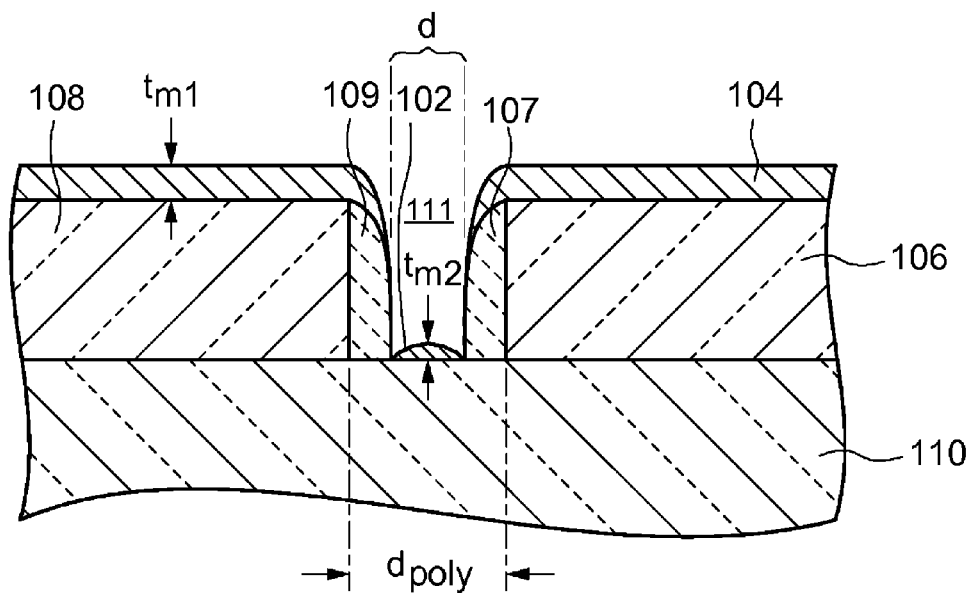
FIG. 1A is a cross section of a portion of a partially fabricated E-fuse with a metal filament for forming a fuse link according to an embodiment

FIG. 1A is a cross section of a portion of a partially fabricated E-fuse 100 with a metal filament 102 for forming a fuse link according to an embodiment. A silicide-forming layer 104 is deposited to a thickness $t_{M1}$ over polysilicon structures 106, 108 and on a silicon substrate 110. Sidewall spacers 107, 109, which are typically a dielectric material, are formed on the sidewalls of the polysilicon structures 106, 108. In a particular embodiment, the polysilicon structures 106, 108 are formed concurrently with polysilicon gates of FETs in an IC fabrication sequence, and the sidewall spacers 107, 109 are formed concurrently with gate sidewall spacers, as is known in the art of IC fabrication.

In a particular embodiment, the silicide-forming layer 104 is a layer of metal, such as cobalt or other silicide-forming metal, of which several are well-known, and the spacers 106, 108 are polysilicon spacers that are fabricated to be a minimum spacing apart $d_{poly}$.

As is well known in the art of IC fabrication, different features have different minimum spacings, also known as critical minimum spacings, that depend on the node geometry that the IC is designed in. For example, the minimum poly-to-poly spacing in a 90 nm node design is usually greater than the minimum poly-to-poly spacing in a 65 nm node design or in a 45 nm node design. The minimum spacing $d_{poly}$ is the minimum poly-to-poly spacing for an arbitrary node geometry. A gap is formed between the polysilicon structures 106, 108 having an initial width of $d_{poly}$.

The sidewall spacers 107, 109 reduce the spacing between the polysilicon structures 106, 108 so that the width d of the metal filament 102 is less than the minimum poly spacing $d_{poly}$. The metal filament 102 is deposited in a gap 111 between the sidewall spacers 107, 109. The gap 111 has a width less than the initial width. The polysilicon structures 106, 108 and the sidewall spacers 107, 109 also provide a shadowing effect in some embodiments so that the thickness of the metal filament 102 $t_{M2}$ is less than the thickness $t_{M1}$ of the metal layer 104 formed on the field of the device. In a particular embodiment, the width d of the metal filament is less than a minimum lithographic feature size. A metal filament of such nature is commonly referred to as "sublithographic" because the dimension d is below the dimension that can be reliably established by the lithographic process (e.g., $d_{poly}$) for a given node spacing design (e.g., 90 nm design).

Figure 1B:
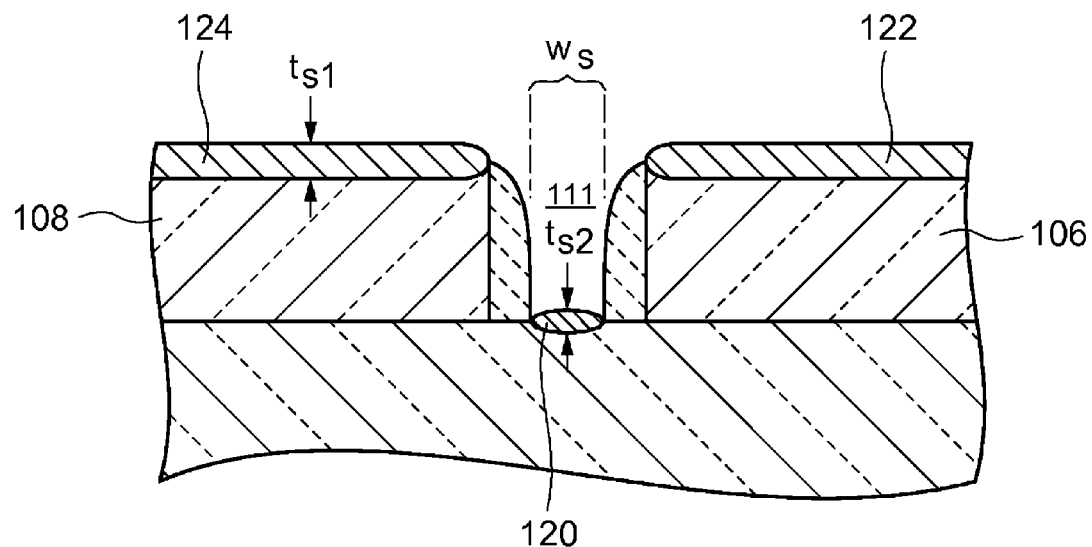
FIG. 1B is a cross section of the portion of the E-fuse of FIG. 1A after alloying the metal filament with silicon to form a silicide filament link.

FIG. 1B is a cross section of the portion of the E-fuse 100 of FIG. 1A after alloying the metal filament with silicon to form a silicide filament link 120. The silicide filament link 120 is formed in the gap 111 and in a particular embodiment has a thickness $t_{S2}$ that is less than the thickness $t_{s1}$ of the field silicide 122, 124 formed on the polysilicon spacers 106, 108 and elsewhere on field silicon. The width $W_s$ of the silicide filament link 120 is less than the minimum poly-to-poly spacing (see $d_{poly}$ in FIG. 1A). The reduced thickness $t_{S2}$ of the silicide filament link 120 and the narrow width $W_s$ provide a fuse link with a very small cross section, which results in a reduced programming energy requirement and more reliable programming. Embodiments are also easily scalable to smaller node geometries because the minimum poly spacing the sidewall spacer dimensions scale to the smaller node geometry.

Figure 2A:
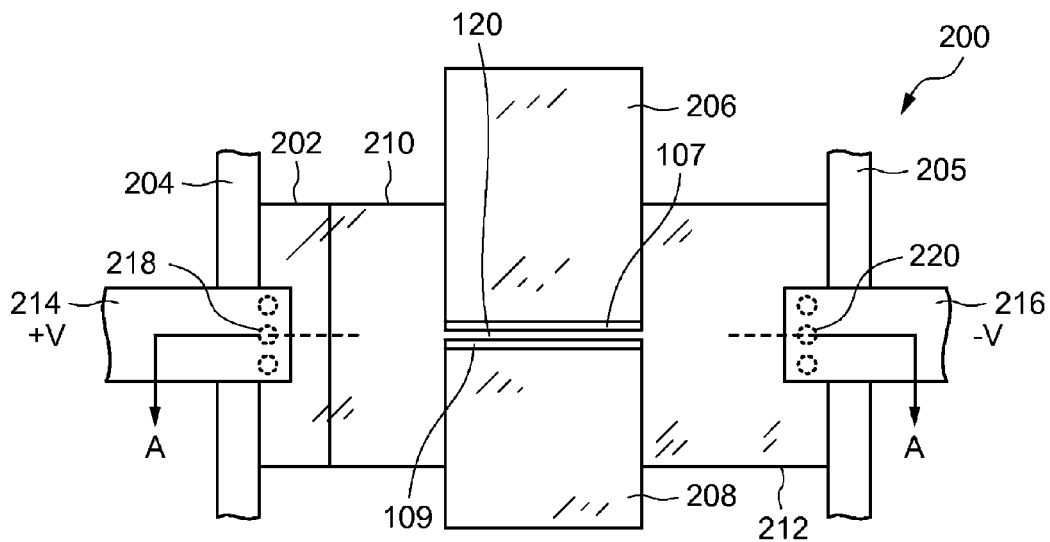
FIG. 2A is a plan view of an E-fuse according to an embodiment.

FIG. 2A is a plan view of an E-fuse 200 according to an embodiment. An oxide layer (see FIG. 2B, ref. num. 221) has been removed so that underlying features may be shown. An N+ type diffusion area 202, an N-type lightly doped drain diffusion ("NLDD") 210, and a P+ type diffusion area 212 have been formed during a CMOS fabrication sequence and silicided. The diffusions are performed after formation of the polysilicon structures 206, 208, and the NLDD and P+ diffusions are blocked the polysilicon structures 206, 208 except in the gap (see FIG. 1A, ref. num. 111). The NLDD and P+ diffusions occur in the gap (see d, FIG. 1A) between the sidewall spacers 107, 109, and hence under the filament link 120. The NLDD 210 meets the P+ diffusion 210 beneath the silicide filament link 120 at a boundary (see FIG. 2B, ref. num. 213).

A P-type well (see FIG. 2B, ref. num. 228) is formed in the silicon substrate (see FIG. 2B, ref. num. 226), the polysilicon structures 206, 208 are formed on the well area, and the diffusion areas 202, 210, 212 are formed in the well where they are not blocked by the polysilicon.

P-N junctions are formed between the N+ and NLDD 202, 210 and the P-type well, and between the NLDD 210 and the P+ diffusion 212. A tap (not shown) is typically provided to bias the well to a selected electrical potential relative to other terminals of the fuse, as is known in the art, and can be used to reverse bias the PN junctions. Isolation structures 204, 205, such as trenches filled with dielectric material, electrically isolate the E-fuse from adjacent devices, as is well-known in the art of IC design and fabrication. Alternatively, the E-fuse is formed in an N-well and a diffusion area is a P-type LDD area.

Polysilicon structures 206, 208 are fabricated to be within a minimum poly-to-poly spacing, and the silicide filament link 120 has been formed in the area between the sidewall spacers 107, 109. The polysilicon structures are drawn about 1 micron wide and poly rounding is not an issue. The width of the silicide filament link 120 is less than the minimum poly-to-poly spacing for the node geometry of the IC. Conductive traces 214, 216 formed in a first patterned metal layer (commonly called "M1 layer") are connected to programming or sense circuits (not shown) through contacts 218, 220, which are shown as dashed lines because they underlie the traces 214, 216 (see also, FIG. 2B, ref. nums. 218, 220). The contacts 218, 220 electrically connect the traces 214, 216 to the silicide filament link. The only appreciable current path between one side of the fuse (e.g., area 202) and the other (e.g., 212) is through the silicide filament link 120. When the silicide filament link is broken (fused) during programming, the low-resistance path is destroyed, and a high resistance is established between one side of the fuse and the other.

Figure 2B:
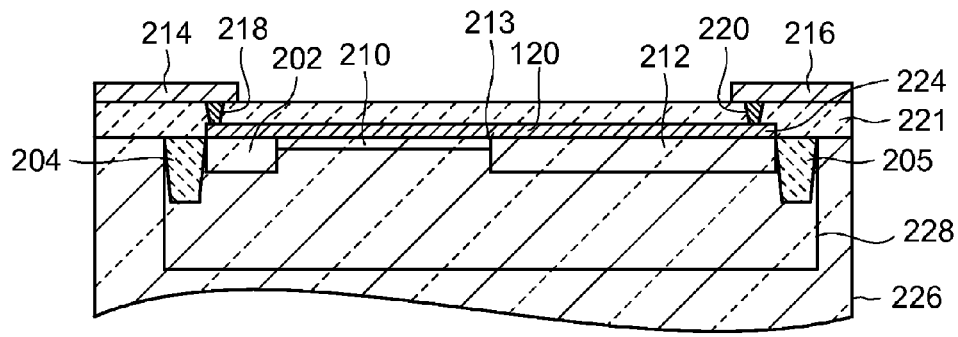
FIG. 2B is a cross section of the E-fuse of FIG. 2A taken along section line A-A.

FIG. 2B is a cross section of the E-fuse 200 of FIG. 2A taken along section line A-A. FIG. 2B shows the isolation structures 204, 205, the N+ diffusion 202, NLDD 210, and the P+ diffusion 212. The section line is taken along the silicide filament link that was formed in the gap between the polysilicon structures (see FIG. 2A, ref. nums. 206, 208) and, the NLDD 210 and P+ diffusion 212 have been formed in the gap under the silicide filament link 120. The boundary 213 between the NLDD 210 and the P+ diffusion 212 is below the silicide filament link (see FIG. 2A). Field silicide 224 is formed over exposed silicon areas, which includes the N+ diffusion 202, the NLDD 210, and the P+ diffusion 212. The contacts 218, 220 extend through an oxide layer 221 and electrically connect the traces 214, 216 to the silicided diffusion areas 202, 212. A portion of the NLDD 210 below the silicide remains after silicidation, forming a P-N junction with the P-well.

Before programming, the silicide filament link provides a low resistance current path between the contacts 214, 216. After the silicide filament link 120 has been blown during programming, the P-N junction blocks current flow from one trace 214 to another 216 to provide high resistance (typically at least 100 times the pre-programming resistance) between the contacts 214, 216.

A conventional fuse link requires more energy to program than the silicide filament link 120. This higher programming energy can result in more damage to the surrounding material, both above the link in what is commonly called the BEOL (back end of line) structures, and to the silicon surrounding the link. Such damage can result in a current path that causes the resistance between traces 214, 216 to be less than the desired programmed resistance for the E-fuse.

The reduced programming energy needed to fuse the small cross sectional area of the silicide filament link 120 is less likely to cause such damage. Even if slight programming damage occurs, the damage is likely to be limited to the NLDD region 202, which forms a P-N junction with the P-well 228 that blocks substantial current flow between the traces, providing a programmed E-fuse with a high programmed resistance.

Figure 3A:
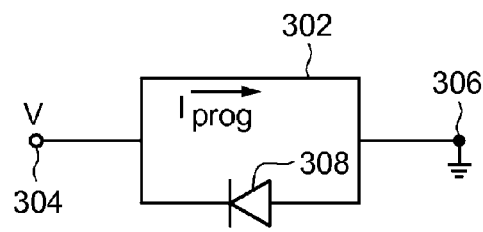
FIG. 3A is circuit representation of the E-fuse of FIG. 2A before programming.

FIG. 3A is circuit representation of the E-fuse of FIG. 2A before programming. The silicide filament link provides essentially a short 302 between terminals 304, 306 (e.g., traces 214, 216 of FIG. 2B). The N-type LDD (FIG. 2B, ref. num. 202) forms a diode 308 with the P-well (FIG. 2B, ref. num 228). The diode is reversed biased, and the programming current $I_{prog}$ flows through the silicide filament link 302. Sufficient programming current is applied to fuse the link during programming.

Figure 3B:
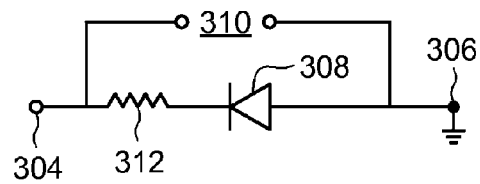
FIG. 3B is a circuit representation of the E-fuse of FIG. 2A after programming.

FIG. 3B is a circuit representation of the E-fuse of FIG. 2A after programming. The silicide filament link has been blown, creating an open 310. The diode 308 formed between the NLDD and the P well or P+ diffusion prevents current from flowing between the terminals 304, 306, even if programming damage creates a resistive current path 312 in the NLDD.

Figure 4:
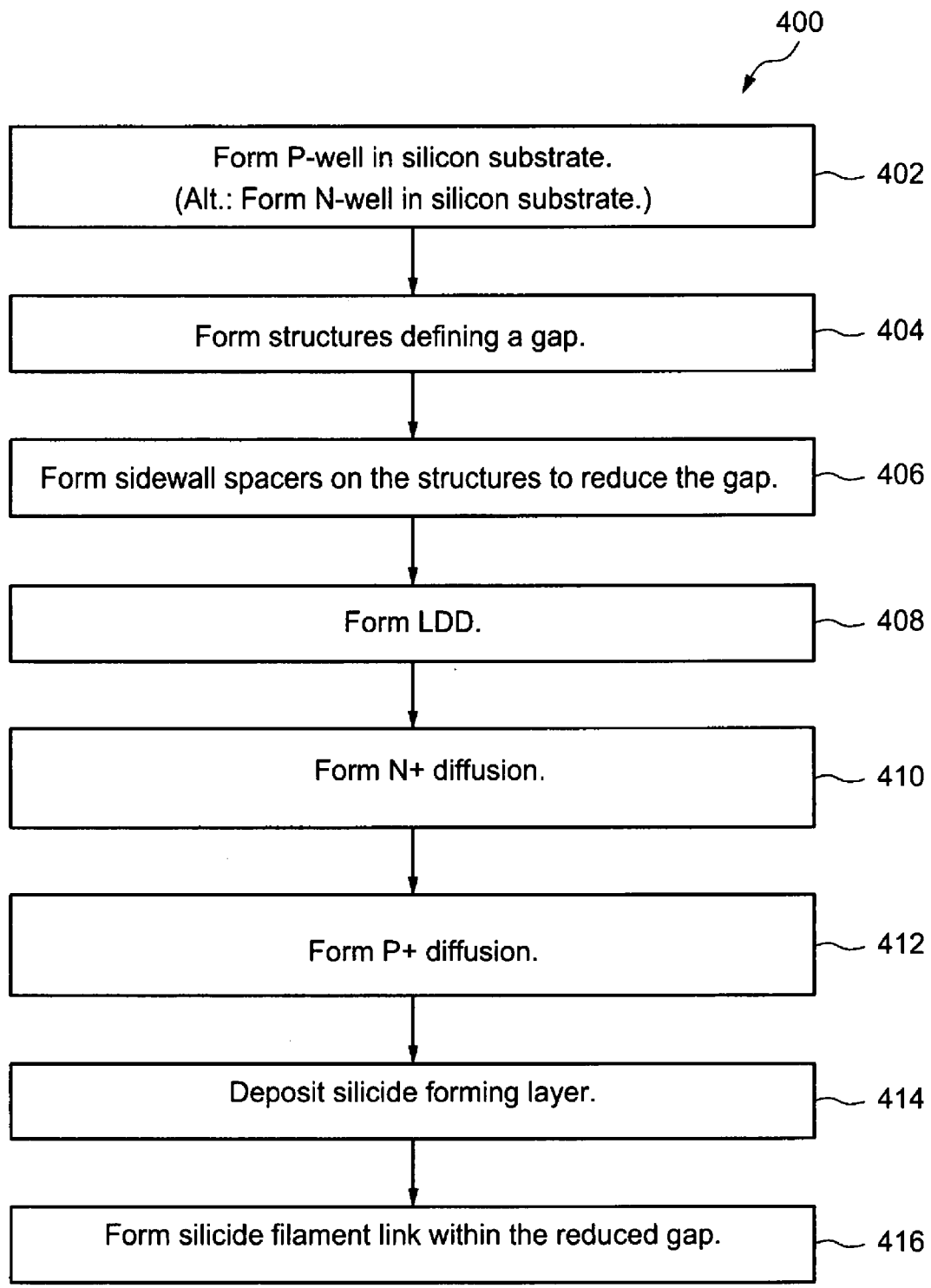
FIG. 4 is a flow chart of fabricating an E-fuse according to an embodiment.

FIG. 4 is a flow chart of a method 400 of fabricating an E-fuse according to an embodiment. A well having a first conductivity type (e.g., P-type well) is formed in a silicon substrate (step 402). First and second structures are formed on the surface of the silicon substrate, the first structure being separated from the second structure by a minimum spacing according to a node spacing geometry defining a gap between the first structure and the second structure (step 404). Alternatively, the gap is greater than the minimum spacing. Sidewall spacers are formed on the sidewalls of the first and second structures to reduce the gap (step 406). In a particular embodiment, the reduced gap has a dimension less than the minimum spacing.

A lightly doped diffusion having a second conductivity type (e.g., NLDD) is formed in the well (step 408). A first diffusion having the second conductivity type (e.g., N+ diffusion) is formed in the well (step 410). A second diffusion having the first conductivity type (e.g., P+ diffusion) is formed in the well (step 412). After completing these three steps, the lightly doped diffusion may be located between the first diffusion and the second diffusion. The above sequence of forming the diffusions is not essential. For example, the P+ diffusion could be formed before the N+ diffusion; however, the LDD is usually performed prior to the P+/N+ implants.

A silicide forming layer is deposited on the substrate (step 414). The silicon substrate is processed to form a silicide filament link in the gap between the first and second structures (step 416). Typically, silicide is also formed on the exposed silicon surface of the first diffusion and the remaining portions of the exposed silicon surfaces of the lightly doped diffusion and the second diffusion, and other areas of exposed silicon of the substrate, such as silicon gate and source/drain contact areas of FETs.

Figure 5:
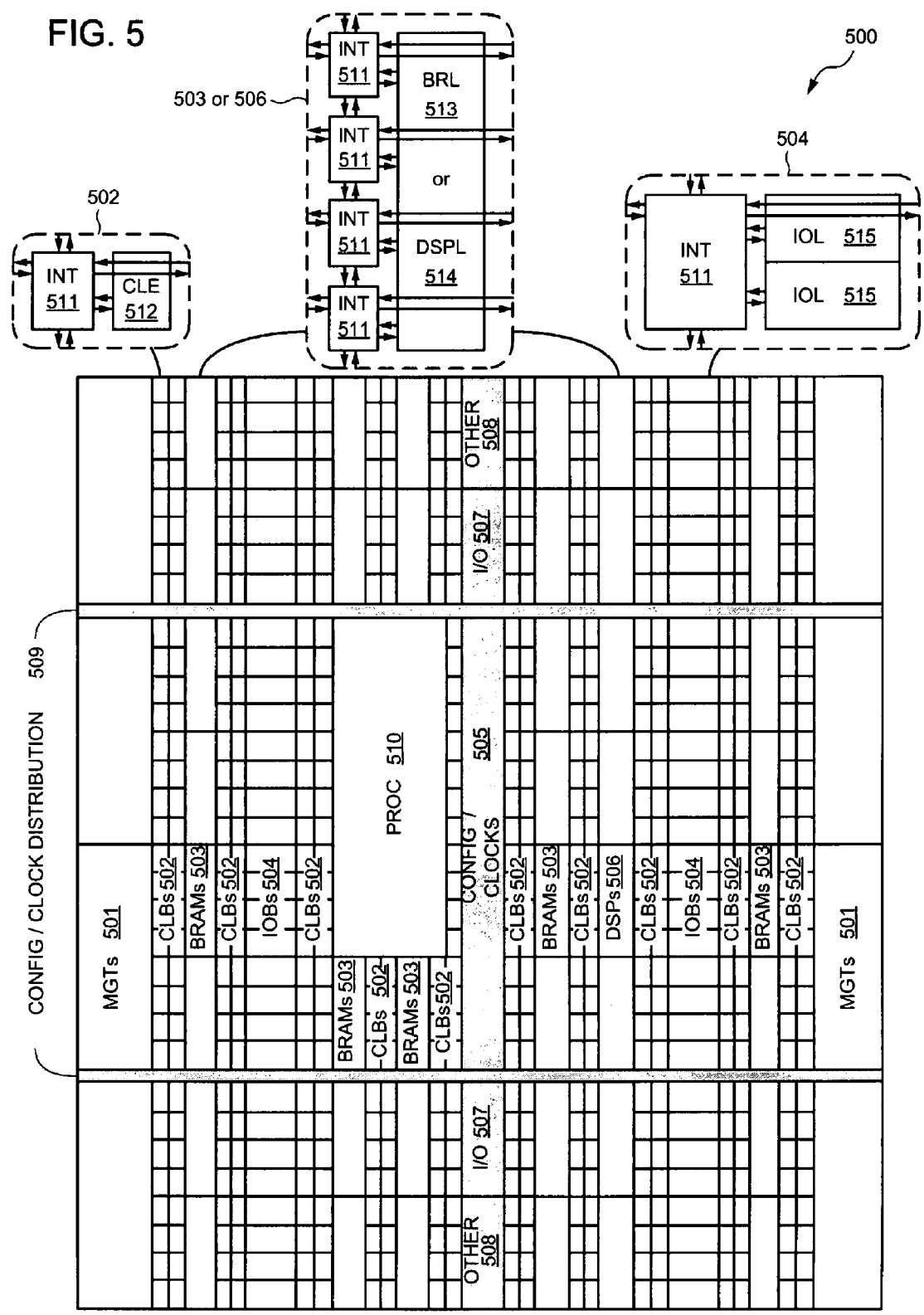
FIG. 5 is a plan view of an integrated circuit according to an embodiment of the invention.

FIG. 5 is a plan view of an integrated circuit 500 according to an embodiment of the invention. The integrated circuit is an FPGA that includes CMOS portions in several of the functional blocks, such as in RAM and logic, and is fabricated using a CMOS fabrication process. E-fuses according to one or more embodiments of the invention are incorporated in any of several functional blocks, such as a memory block, logic block, I/O block, clock circuit, transceiver, or other functional block; within many functional blocks; or within a physical section or segment of the FPGA 500. E-fuses according to embodiments of the invention are particularly desirable in FPGAs because they can be fabricated using standard CMOS fabrication techniques, and their design and operation can be scaled to smaller node geometry designs. The small cross section of the silicide fuse link allows E-fuses to be programmed with low energy, and the P-N junction formed between the anode and cathode of the E-f use reliably indicates a programming state after programming, even in the event of programming fuse damage or irrespective of the initial fuse resistance arising due to process variations. In other words, the initial fuse resistance value is not as critical for correctly distinguishing a programmed fuse from an unprogrammed fuse. E-fuses are desirable for many applications in an FPGA, such as storing a device serial number, device configuration information, or encryption codes.

The FPGA architecture includes a large number of different programmable tiles including multi-gigabit transceivers (MGTs 501), configurable logic blocks (CLBs 502), random access memory blocks (BRAMs 503), input/output blocks (IOBs 504), configuration and clocking logic (CONFIG/CLOCKS 505), digital signal processing blocks (DSPs 506), specialized input/output blocks (I/O 507) (e.g., configuration ports and clock ports), and other programmable logic 508 such as digital clock managers, analog-to-digital converters, system monitoring logic, and so forth. Some FPGAs also include dedicated processor blocks (PROC 510).

In some FPGAs, each programmable tile includes a programmable interconnect element (INT 511) having standardized connections to and from a corresponding interconnect element in each adjacent tile. Therefore, the programmable interconnect elements taken together implement the programmable interconnect structure for the illustrated FPGA. The programmable interconnect element (INT 511) also includes the connections to and from the programmable logic element within the same tile, as shown by the examples included at the top of FIG. 5.

For example, a CLB 502 can include a configurable logic element (CLE 512) that can be programmed to implement user logic plus a single programmable interconnect element (INT 511). A BRAM 503 can include a BRAM logic element (BRL 513) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 506 can include a DSP logic element (DSPL 514) in addition to an appropriate number of programmable interconnect elements. An IOB 504 can include, for example, two instances of an input/output logic element (IOL 515) in addition to one instance of the programmable interconnect element (INT 511). As will be clear to those of skill in the art, the actual I/O pads connected, for example, to the I/O logic element 515 are manufactured using metal layered above the various illustrated logic blocks, and typically are not confined to the area of the input/output logic element 515. In the pictured embodiment, a columnar area near the center of the die (shown shaded in FIG. 5) is used for configuration, clock, and other control logic.

Some FPGAs utilizing the architecture illustrated in FIG. 5 include additional logic blocks that disrupt the regular columnar structure making up a large part of the FPGA. The additional logic blocks can be programmable blocks and/or dedicated logic. For example, the processor block PROC 510 shown in FIG. 5 spans several columns of CLBs and BRAMs.

Note that FIG. 5 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 5 are purely exemplary. For example, in an actual FPGA more than one adjacent column of CLBs is typically included wherever the CLBs appear, to facilitate the efficient implementation of user logic.

While the present invention has been described in connection with specific embodiments, variations of these embodiments will be obvious to those of ordinary skill in the art. Other materials may be used to form the spacers and other separation may be suitable to form thin silicide filament links. Therefore, the spirit and scope of the appended claims should not be limited to the foregoing description.

The invention claimed is:

1. An electronic fuse ("E-fuse") comprising:
   a silicon substrate;
   a well of a first conductivity type formed in the silicon substrate;
   a first polysilicon structure formed over a first portion of the well;
   a second polysilicon structure formed over a second portion of the well spaced apart from the first polysilicon structure by a spacing distance so as to form a gap between the first polysilicon structure and the second polysilicon structure;
   a silicide filament link extending along the gap disposed between the first polysilicon structure and the second polysilicon structure;
   a first diffusion of a second conductivity type formed in the well;
   a second diffusion of the first conductivity type formed in the well; and a lightly doped diffusion of the second conductivity type formed in the well between the first diffusion and the second diffusion.

2. The E-fuse of claim 1 further comprising
a first sidewall spacer formed on a first sidewall of the first polysilicon structure extending into the gap; and
a second sidewall spacer formed on a second sidewall of the second polysilicon structure extending into the gap, the silicide filament link having a filament width less than the spacing distance.

3. The E-fuse of claim 1 wherein the second diffusion extends along the gap in a first direction and the lightly doped diffusion extends along the gap in an opposite direction so as to form a boundary between the lightly doped diffusion and the second diffusion under the silicide filament link.

4. The E-fuse of claim 1 wherein the silicide filament link comprises silicon from at least the lightly doped diffusion.

5. The E-fuse of claim 4 wherein the silicide filament link further comprises silicon from the second diffusion.

6. The E-fuse of claim 1 wherein the spacing distance is a minimum poly-to-poly spacing distance.

7. The E-fuse of claim 1 wherein the silicide filament link has a filament width less than a minimum lithographic feature size.

8. The E-fuse of claim 1 wherein field silicide is formed on a portion of the first diffusion, the field silicide having a first silicide thickness and the silicide filament link having a second silicide thickness, the second silicide thickness being less than the first silicide thickness.

9. The E-fuse of claim 1 wherein the E-fuse is a non-volatile memory element in a CMOS integrated circuit.

10. The E-fuse of claim 9 wherein the E-fuse comprises a portion of a device serial number, device configuration information, or an encryption code of a field-programmable gate array.

11. The E-fuse of claim 1 wherein the well is a P-type well, and the lightly doped diffusion is an N-type lightly doped diffusion.

12. The E-fuse of claim 1 wherein the silicide filament link extends from a first contact to a second electrical contact, and a P-N junction is formed under the silicide filament link between the second diffusion of the first conductivity type and the lightly doped diffusion of the second conductivity type.

13. The E-fuse of claim 1 wherein the lightly doped diffusion is not formed in the well beneath the first polysilicon structure and the second diffusion is not formed in the well beneath the first polysilicon structure.

14. A method of fabricating an electronic fuse ("E-fuse") comprising:
forming a well having a first conductivity type in a silicon substrate;
forming first polysilicon structure over a first portion of the well and a second polysilicon structure over a second portion of the well on a surface of the substrate so as to define a gap over a third portion of the well;
forming a first sidewall spacer on a first sidewall of the first polysilicon structure and a second sidewall spacer on a second sidewall of the second polysilicon structure;
forming a lightly doped diffusion of a second conductivity type in the well;
forming a first diffusion of the second conductivity type in the well;
forming a second diffusion of the first conductivity type in the well, the lightly doped diffusion being disposed between the first diffusion and the second diffusion;
depositing a silicide forming layer on the silicon substrate; and
siliciding the silicon substrate to form a silicide filament link extending along the gap between the first sidewall spacer and the second sidewall spacer.

15. The method of claim 14 wherein the element of forming the first polysilicon structure over the first portion of the well and the second polysilicon structure over a second portion of the well comprises depositing a polysilicon layer on the surface of the substrate and further includes defining gate structures of a CMOS integrated circuit concurrently with the first and second structures from the polysilicon layer.

16. The method of claim 15 wherein the element of forming the first sidewall spacer and the second sidewall spacer further includes forming gate sidewall spacers on the gate structures.

17. The method of claim 15 wherein the steps elements of depositing a silicide forming layer and of siliciding the silicon substrate include siliciding the gate structures.

18. The method of claim 17 wherein silicide is further formed on the first diffusion, the second diffusion, and the lightly doped diffusion.

19. The method of claim 14 wherein the well is a P-type well, and the lightly doped diffusion is an N-type diffusion.

20. An electronic fuse (E-fuse) comprising:
a silicon substrate;
a well of a first conductivity type formed in the silicon substrate;
a first polysilicon structure formed over a first portion of the well;
a second polysilicon structure formed over a second portion of the well spaced apart from the first polysilicon structure by a spacing distance so as to form a gap between the first polysilicon structure and the second polysilicon structure;
a silicide filament link having a length extending along the gap from a first contact to a second contact, the length being transverse to the spacing distance;
a first sidewall spacer formed on a first sidewall of the first polysilicon structure disposed between and proximate to both the silicide filament link and the first polysilicon structure along the length of the silicide filament link; and
a second sidewall spacer formed on a second sidewall of the second polysilicon structure disposed between and proximate to both the silicide filament link and the second polysilicon structure along the length of the silicide filament link.

* * * * *